US012787253B2

(12) United States Patent
Kim et al.

(10) Patent No.: US 12,787,253 B2
(45) Date of Patent: Nov. 3, 2026

(54) SEMICONDUCTOR MEMORY DEVICES

(71) Applicant: Samsung Electronics Co., Ltd., Suwon-si (KR)

(72) Inventors: Yangdoo Kim, Suwon-si (KR); Sangwuk Park, Suwon-si (KR); Minkyu Suh, Suwon-si (KR); Geonyeop Lee, Suwon-si (KR); Dokeun Lee, Suwon-si (KR); Jungpyo Hong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 270 days.

(21) Appl. No.: 18/527,450

(22) Filed: Dec. 4, 2023

(65) Prior Publication Data

US 2024/0224502 A1 Jul. 4, 2024

(30) Foreign Application Priority Data

Dec. 28, 2022 (KR) ........................ 10-2022-0187756

(51) Int. Cl.
*H10B 12/00* (2023.01)

(52) U.S. Cl.
CPC .................................. *H10B 12/315* (2023.02)

(58) Field of Classification Search
CPC .... H10B 12/033; H10B 12/315; H10D 1/042; H10D 1/716; H10D 1/00; H10D 8/00; H10D 10/00; H10D 12/00; H10D 48/00; H10D 62/00; H10D 64/00; H10D 80/00; H10D 86/00; H10D 84/00; H10D 87/00; H10D 88/00; H10D 89/00; H10D 99/00; H10D 1/60; H10D 1/62; H10D 1/68; H10D 1/682; H10D 1/692; H10D 1/694; H10D 1/696; H10D 1/711; H10D 1/714; H10D 1/712; H10D 1/66; H10D 1/64; H10D 1/665; H10D 64/011; H10D 64/01
See application file for complete search history.

(56) References Cited

U.S. PATENT DOCUMENTS

| | | | | |
|---|---|---|---|---|
| 6,762,107 | B2 * | 7/2004 | Watanabe ................ | H01G 4/33 257/532 |
| 7,544,563 | B2 | 6/2009 | Manning | |
| 8,969,935 | B2 * | 3/2015 | Uchiyama .............. | H10D 1/716 257/296 |
| 9,252,205 | B2 | 2/2016 | Rhie | |

(Continued)

FOREIGN PATENT DOCUMENTS

KR 10-2014-0065186 A 5/2014

*Primary Examiner* — Leonard Chang
*Assistant Examiner* — Nimarta Kaur Chowdhary
(74) *Attorney, Agent, or Firm* — Muir Patent Law, PLLC

(57) ABSTRACT

A semiconductor memory device includes a substrate having a memory cell region and a plurality of capacitor structures in the memory cell region of the substrate, each of the plurality of capacitor structures including a lower electrode, a capacitor dielectric layer, and an upper electrode, wherein the lower electrode includes a first lower electrode, a second lower electrode above the first lower electrode, and a connecting lower electrode connecting a top end of the first lower electrode to a bottom end of the second lower electrode, wherein the upper electrode includes a bent upper electrode overlapping the connecting lower electrode in a horizontal direction, and the bent upper electrode includes a bent portion.

20 Claims, 17 Drawing Sheets

(56) References Cited

U.S. PATENT DOCUMENTS

| | | | |
|---|---|---|---|
| 9,349,724 | B2 | 5/2016 | Kim et al. |
| 10,032,778 | B2 * | 7/2018 | Kim ....................... H10D 1/684 |
| 11,270,933 | B2 | 3/2022 | Han et al. |
| 2011/0012184 | A1 | 1/2011 | Yuki |
| 2014/0231959 | A1 | 8/2014 | Miyajima |
| 2021/0210593 | A1 | 7/2021 | Kim |
| 2021/0391414 | A1 | 12/2021 | Xia et al. |

* cited by examiner

SEMICONDUCTOR MEMORY DEVICES

CROSS-REFERENCE TO RELATED APPLICATION

This application is based on and claims priority under 35 U.S.C. § 119 to Korean Patent Application No. 10-2022-0187756, filed on Dec. 28, 2022, in the Korean Intellectual Property Office, the disclosure of which is incorporated by reference herein in its entirety.

BACKGROUND

The inventive concept relates to semiconductor memory devices, and more particularly, to semiconductor memory devices having a capacitor structure.

With the rapid development of the electronics industry and user needs, electronic devices are becoming lighter and more compact. Accordingly, semiconductor memory devices used in electronic devices are required to have a high integration density, and thus, the design rules for the components of semiconductor memory devices have been decreased, resulting in microstructuring. However, semiconductor memory devices having a capacitor structure typically need to secure the capacity of a capacitor together with microstructuring.

SUMMARY

Aspects of the inventive concept provide a semiconductor memory device allowing a first lower electrode and a second lower electrode to be connected and aligned with each other in a two-stage pillar capacitor structure including the first lower electrode and the second lower electrode above the first lower electrode.

The inventive concept is not limited to those mentioned above, and other aspects that have not been mentioned will be clearly understood by one of ordinary skill in the art from the description below.

According to an aspect of the inventive concept, a semiconductor memory device includes a substrate having a memory cell region and a plurality of capacitor structures in the memory cell region of the substrate, each of the plurality of capacitor structures including a lower electrode, a capacitor dielectric layer, and an upper electrode, wherein the lower electrode includes a first lower electrode, a second lower electrode above the first lower electrode, a connecting lower electrode connecting a top end of the first lower electrode to a bottom end of the second lower electrode, a first connection surface formed by a top surface of the first lower electrode and a bottom surface of the connecting lower electrode in contact with each other, and a second connection surface formed by a bottom surface of the second lower electrode and a top surface of the connecting lower electrode in contact with each other, and wherein the upper electrode includes a bent upper electrode overlapping the connecting lower electrode in a horizontal direction, and the bent upper electrode includes a bent portion.

According to another aspect of the inventive concept, a semiconductor memory device includes a substrate having a memory cell region and a plurality of capacitor structures in the memory cell region of the substrate, each of the plurality of capacitor structures including a lower electrode, a capacitor dielectric layer, and an upper electrode, wherein the lower electrode includes a first lower electrode, a second lower electrode above the first lower electrode, a connecting lower electrode connecting a top end of the first lower electrode to a bottom end of the second lower electrode, a first connection surface formed by a top surface of the first lower electrode and a bottom surface of the connecting lower electrode in contact with each other, and a second connection surface formed by a bottom surface of the second lower electrode and a top surface of the connecting lower electrode in contact with each other, wherein the upper electrode includes a bent upper electrode overlapping a side surface of the connecting lower electrode in a horizontal direction, and the bent upper electrode includes a bent portion, wherein the bent upper electrode includes a first bent upper electrode and a second bent upper electrode, the first bent upper electrode has a side surface separated by a constant distance from and facing the side surface of the connecting lower electrode, and the second bent upper electrode is connected to a top end of the first bent upper electrode and has a side surface separated by a constant distance from and parallel with a side surface of the second lower electrode, and wherein the first lower electrode is offset from the second lower electrode.

According to a further aspect of the inventive concept, a semiconductor memory device includes a substrate having a memory cell region and a plurality of capacitor structures in the memory cell region of the substrate, each of the plurality of capacitor structures including a lower electrode, a capacitor dielectric layer, and an upper electrode, wherein the lower electrode includes a first lower electrode, a second lower electrode above the first lower electrode, a connecting lower electrode connecting a top end of the first lower electrode to a bottom end of the second lower electrode, a first connection surface formed by a top surface of the first lower electrode and a bottom surface of the connecting lower electrode in contact with each other, and a second connection surface formed by a bottom surface of the second lower electrode and a top surface of the connecting lower electrode contacting each other, wherein the upper electrode includes a bent upper electrode overlapping the connecting lower electrode in a horizontal direction, and the bent upper electrode includes a bent portion, wherein the bent upper electrode includes a first bent upper electrode and a second bent upper electrode, the first bent upper electrode having a side surface separated by a constant distance from and facing the side surface of the connecting lower electrode, and the second bent upper electrode connected to a top end of the first bent upper electrode and having a side surface separated by a constant distance from and parallel with a side surface of the second lower electrode, the first lower electrode is offset from the second lower electrode, and a value of the offset between the first lower electrode and the second lower electrode is less than a vertical length of one of the first lower electrode and the second lower electrode.

BRIEF DESCRIPTION OF THE DRAWINGS

Embodiments will be more clearly understood from the following detailed description taken in conjunction with the accompanying drawings in which.

DETAILED DESCRIPTION OF THE EMBODIMENTS

Figure 1:
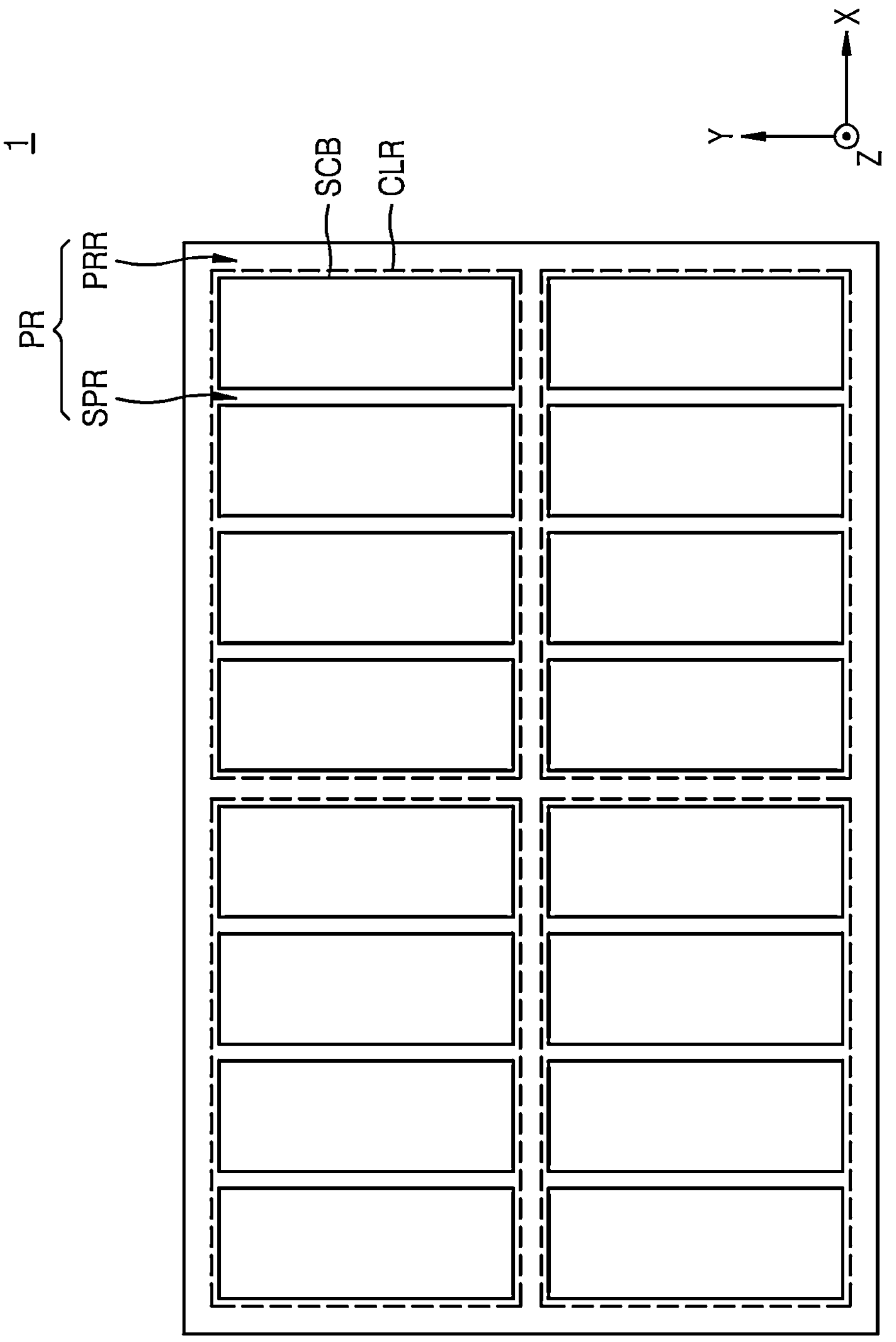
FIG. 1 is a diagram of a semiconductor memory device according to some embodiments.

Hereinafter, embodiments will be described with reference to the accompanying drawings. In the drawings, like reference characters denote like elements, and redundant descriptions thereof will be omitted.

FIG. 1 is a diagram of a semiconductor memory device according to some embodiments.

Referring to FIG. 1, a semiconductor memory device 1 may include a cell region CLR, in which memory cells are arranged, and a main peripheral region PRR surrounding the cell region CLR.

According to an embodiment, the cell region CLR may include sub peripheral regions SPR separating cell blocks SCB from one another. A plurality of memory cells may be arranged in each of the cell blocks SCB. Here, a cell block SCB may be a region in which memory cells are regularly arranged at uniform intervals.

Logic cells for input/output of electrical signals to/from the memory cells may be arranged in the main peripheral region PRR and each of the sub peripheral regions SPR. In some embodiments, the main peripheral region PRR may be a peripheral circuit region, and each sub peripheral region SPR may be a core circuit region. A peripheral region PR may include the main peripheral region PRR and the sub peripheral regions SPR. For example, the peripheral region PR may correspond to and/or may be a core and peripheral circuit region including a peripheral circuit region and a core circuit region. In some embodiments, at least a portion of each sub peripheral region SPR may be used only to separate cell blocks SCB from each other, e.g., with no circuit in the portion of the sub peripheral region SPR.

Figure 2:
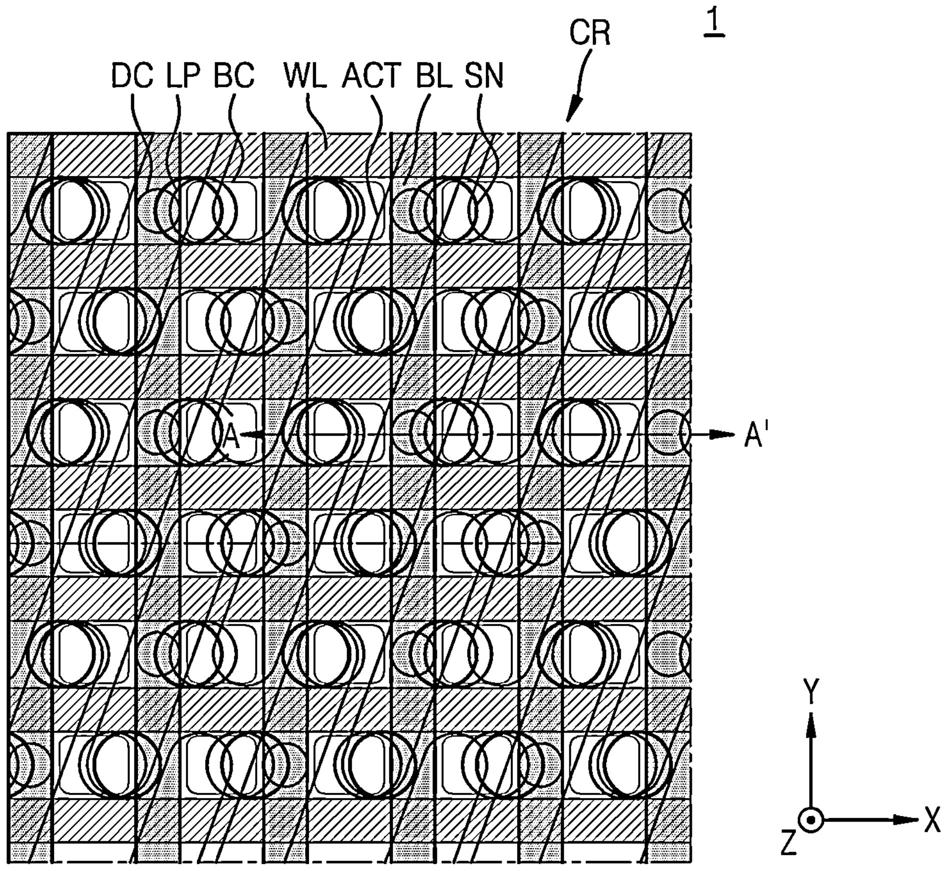
FIG. 2 is a schematic plan view layout of main components of the semiconductor memory device, according to some embodiments.
Figure 3:
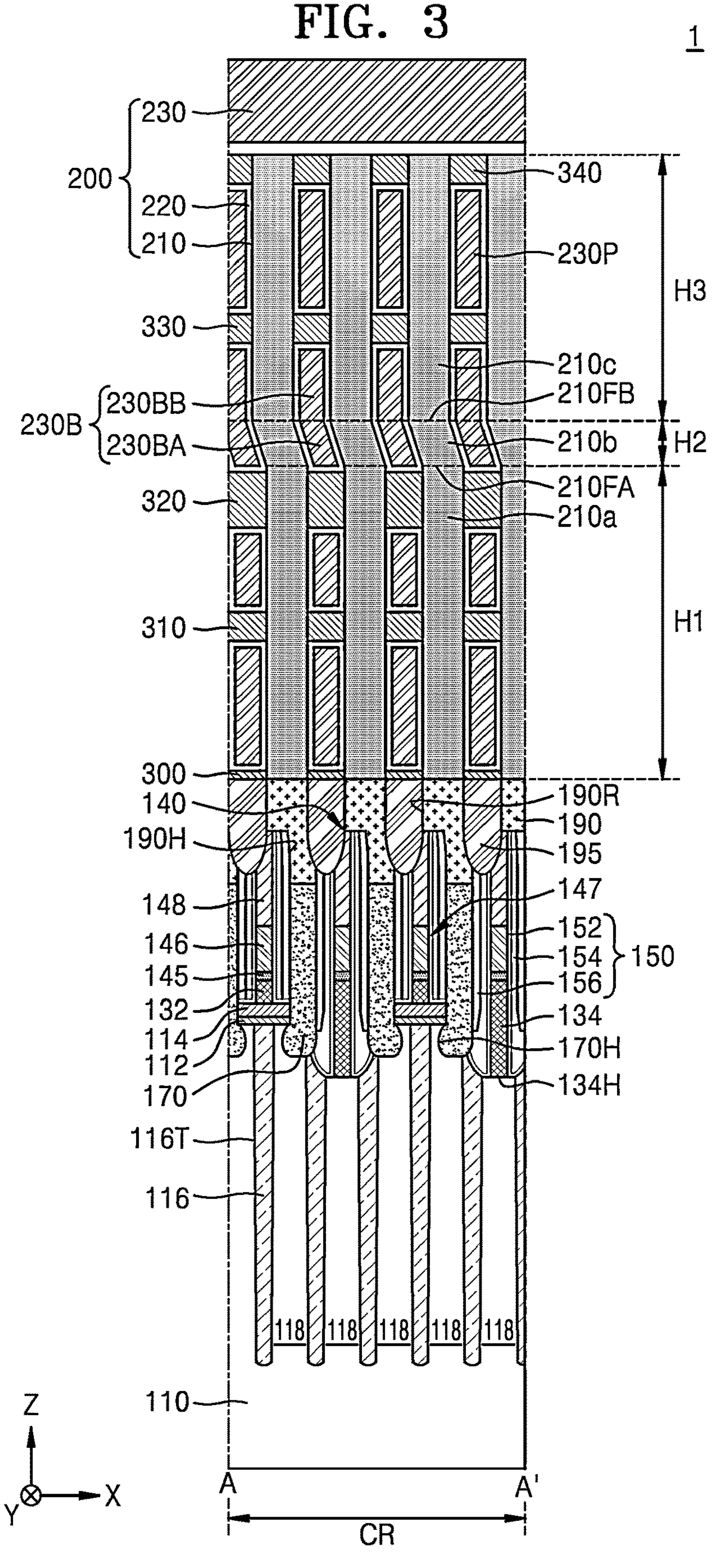
FIG. 3 is a cross-sectional view of the semiconductor memory device according to some embodiments.

For example, each of the cell blocks SCB may include or may be a region (e.g., the whole region) illustrated/shown in FIGS. 2 and 3 (e.g., a memory cell region CR), a memory cell region CR in FIGS. 4A to 4G, or a memory cell region CR in FIGS. 5A to 5G and may correspond to and/or may be a region in which a plurality of active regions 118 described below with reference to FIG. 3 are arranged.

FIG. 2 is a schematic plan view layout of main components of the semiconductor memory device 1, according to some embodiments.

The semiconductor memory device 1 may include a plurality of active regions ACT in the memory cell region CR. In some embodiments, each of the active regions ACT in the memory cell region CR may have a long axis in a diagonal/inclined direction with respect to a first horizontal direction (the X direction) and a second horizontal direction (the Y direction). The active regions ACT may respectively form the active regions 118 in FIG. 3.

A plurality of word lines WL may extend across the active regions ACT to be parallel with each other in the first horizontal direction (the X direction). A plurality of bit lines BL may extend over the word lines WL to be parallel with each other in the second horizontal direction (the Y direction) that crosses the first horizontal direction (the X direction).

In some embodiments, a plurality of buried contacts BC may be between two adjacent bit lines BL among the bit lines BL. In some embodiments, the buried contacts BC may be arranged in line in each of the first horizontal direction (the X direction) and the second horizontal direction (the Y direction).

Ordinal numbers such as “first,” “second,” “third,” etc. may be used simply as labels of certain elements, steps, etc., to distinguish such elements, steps, etc. from one another. Terms that are not described using “first,” “second,” etc., in the specification, may still be referred to as “first” or “second” in a claim. In addition, a term that is referenced with a particular ordinal number (e.g., “first” in a particular claim) may be described elsewhere with a different ordinal number (e.g., “second” in the specification or another claim).

A plurality of landing pads LP may be respectively disposed/formed on the buried contacts BC. The landing pads LP may at least partially overlap (e.g., in a vertical direction) with the buried contacts BC. In some embodiments, each of the landing pads LP may extend to be above one of two adjacent bit lines BL.

A plurality of storage nodes SN may be respectively formed/disposed on the landing pads LP. The storage nodes SN may be partially above (e.g., vertically overlap) the bit lines BL. Each of the storage nodes SN may correspond to and/or may be a lower electrode of a capacitor. Each storage node SN may be electrically connected to an active region ACT through a landing pad LP and a buried contact BC.

FIG. 3 is a cross-sectional view of the semiconductor memory device 1 according to some embodiments. In detail, FIG. 3 is a cross-sectional view taken along line A-A' in FIG. 2.

Referring to FIG. 3, the semiconductor memory device 1 may include the active regions 118 defined by an isolation film 116, a substrate 110 having a plurality of word line trenches (not shown) crossing the active regions 118, a plurality of word lines (not shown) respectively in the word line trenches, a plurality of bit line structures 140, and a plurality of capacitor structures 200 including a plurality of lower electrodes 210, a capacitor dielectric layer 220, and an upper electrode 230.

For example, the substrate 110 may include or be formed of, for example, silicon (Si), crystalline Si, polycrystalline Si, or amorphous Si. In some embodiments, the substrate 110 may include or be formed of a semiconductor element, such as germanium (Ge), or at least one compound semiconductor selected from silicon germanium (SiGe), silicon carbide (SiC), gallium arsenide (GaAs), indium arsenide (InAs), and indium phosphide (InP). In some embodiments, the substrate 110 may have a silicon-on-insulator (SOI) structure. For example, the substrate 110 may include a buried oxide layer (BOX). For example, the substrate 110 may include an impurity-doped well or an impurity-doped structure.

Each of the active regions 118 may be a portion of the substrate 110, which is defined by an isolation trench 116T. Each of the active regions 118 may have a relatively long island shape, which has a short axis and a long axis in a plan view. For example, the long axis may be parallel to a lengthwise direction of the active region 118 in the plan view, and the short axis is perpendicular to the lengthwise direction of the active region 118 in the plan view. In some embodiments, each of the active regions 118 may have a long axis in a diagonal/inclined direction with respect to the first horizontal direction (the X direction) and the second horizontal direction (the Y direction). The active regions 118 may extend with substantially the same length along the long axis and be repeatedly arranged at a substantially constant pitch.

Terms such as "same," "equal," "planar," or "coplanar," as used herein encompass identicality or near identicality including variations that may occur, for example, due to manufacturing processes. The term "substantially" may be used herein to emphasize this meaning, unless the context or other statements indicate otherwise.

The isolation film 116 may fill the isolation trench 116T. The active regions 118 may be defined by the isolation film 116 in the substrate 110.

In some embodiments, the isolation film 116 may be constituted of a triple layer, which includes a first isolation film, a second isolation film, and a third isolation film, but is not limited thereto. For example, the first isolation film may conformally cover/contact the inside and bottom surfaces of the isolation trench 116T. In some embodiments, the first isolation film may include or be formed of silicon oxide. For example, the second isolation film may conformally cover/contact the first isolation film. In some embodiments, the second isolation film may include or be formed of silicon nitride. For example, the third isolation film may cover/contact the second isolation film and fill the isolation trench 116T. In some embodiments, the third isolation film may include or be formed of silicon oxide. For example, the third isolation film may include silicon oxide including tonen silazene (TOSZ). In some embodiments, the isolation film 116 may be constituted of a single layer including one type of insulating film, a double layer including two types of insulating films, or a multi-layer including at least four types/layers of insulating films. For example, the isolation film 116 may be constituted of a single film including or formed of silicon oxide.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

A plurality of word line trenches (not shown) may be formed in the substrate 110 having the active regions 118 defined by the isolation film 116. A gate dielectric film, a word line, and a buried insulating film may be sequentially formed in each of the word line trenches (not shown). A plurality of word lines may respectively form the word lines WL in FIG. 2.

The term "level" or "vertical level" used herein refers to a height from the main surface or the top surface of the substrate 110 in a vertical direction (the Z direction). For example, "being at the same level" or "being at a certain level" refers to "having the same height from the main surface of the substrate 110 in the vertical direction (the Z direction)" or "being at a certain position", and "being at a low/high level" refers to "being at a low/high position with respect to the main surface of the substrate 110 in the vertical direction (the Z direction)".

An insulating film pattern may be formed/disposed on the isolation film 116 and the active regions 118. For example, the insulating film pattern may include or be formed of silicon oxide, silicon nitride, silicon oxynitride, a metal dielectric, or a combination thereof. In some embodiments, the insulating film pattern may have a stack structure of a plurality of insulating films including a first insulating film pattern 112 and a second insulating film pattern 114. In some embodiments, the first insulating film pattern 112 may include or be formed of silicon oxide, and the second insulating film pattern 114 may include or be formed of silicon oxynitride. In some embodiments, the first insulating film pattern 112 may include or be formed of a nonmetal dielectric, and the second insulating film pattern 114 may include or be formed of a metal dielectric. In some embodiments, the second insulating film pattern 114 may be thicker than the first insulating film pattern 112. For example, the first insulating film pattern 112 may have a thickness of about 50 Å to about 90 Å, and the second insulating film pattern 114 may be thicker than the first insulating film pattern 112 and have a thickness of about 60 Å to about 100 Å. For example, the thicknesses of the film patterns 112 and 114 may be distances from a bottom surface to a top surface of the film patterns 112 and 114 in a vertical direction.

A plurality of direct contact conductive patterns 134 may respectively fill a plurality of direct contact holes 134H, each of which passes through the first insulating film patterns 112 and second insulating film patterns 114 and exposes a source region in one of the active regions 118. In some embodiments, each of the direct contact holes 134H may extend (e.g., in a vertical direction) to the inside of one of the active regions 118, e.g., the inside of the source region. For example, the direct contact conductive patterns 134 may include or be formed of doped polysilicon. In some embodiments, the direct contact conductive patterns 134 may include or be formed of an epitaxial silicon layer. The direct contact conductive patterns 134 may respectively form a plurality of direct contacts DC in FIG. 2.

The bit line structures 140 may be formed/disposed on the first insulating film patterns 112 and the second insulating film patterns. Each of the bit line structures 140 may include a bit line 147 and an insulating capping line 148 covering/contacting the bit line 147. The bit line structures 140 may be (e.g., extend) parallel with each other and extend (e.g., lengthwise) in the second horizontal direction (the Y direction) that is parallel with the main surface of the substrate 110. The plurality of bit lines 147 may respectively form the bit lines BL in FIG. 2. The bit lines 147 may be electrically connected to the active regions 118 through the direct contact conductive patterns 134. In some embodiments, each of the bit line structures 140 may further include a conductive semiconductor pattern 132 between the bit line 147, the first insulating film patterns 112 and the second insulating film patterns. For example, the conductive semiconductor pattern 132 may include or be formed of doped polysilicon.

The bit line 147 may have a stack structure of a first metal conductive pattern 145 and a second metal conductive pattern 146, each of which has a line shape, e.g., extending lengthwise in the second horizontal direction Y. In some embodiments, the first metal conductive pattern 145 may include or be formed of titanium nitride (TiN) or Ti—Si—N(TSN), and the second metal conductive pattern 146 may include or be formed of tungsten (W) or a combination of tungsten W and tungsten silicide ($WSi_x$). In some embodiments, the first metal conductive pattern 145 may function as a diffusion barrier. For example, the first metal conductive pattern 145 may be a diffusion barrier layer. In some embodiments, the insulating capping line 148 may include or be formed of silicon nitride.

A plurality of insulating spacer structures 150 may respectively cover/contact the side walls of the bit line structures 140. Each of the insulating spacer structures 150 may include or be formed of a first insulating spacer 152, a second insulating spacer 154, and a third insulating spacer 156. In some embodiments, the insulating spacer structures 150 may extend into the direct contact holes 134H and cover/contact the side walls of the direct contact conductive patterns 134. The second insulating spacer 154 may include or be formed of a material that has a lower permittivity than the first insulating spacer 152 and the third insulating spacer 156. In some embodiments, the first insulating spacer 152 and the third insulating spacer 156 may include or be formed of a nitride, and the second insulating spacer 154 may include or be formed of an oxide. In some embodiments, the first insulating spacer 152 and the third insulating spacer 156 may include or be formed of a nitride, and the second insulating spacer 154 may include or be formed of a material that has an etch selectivity with respect to the first insulating spacer 152 and the third insulating spacer 156. For example, the first insulating spacer 152 and the third insulating spacer 156 may include or be formed of a nitride, and the second insulating spacer 154 may correspond to and/or may be an air spacer. In some embodiments, each of the insulating spacer structures 150 may be constituted of the second insulating spacer 154 including (e.g., formed of) an oxide and the third insulating spacer 156 including (e.g., formed of) a nitride.

A plurality of buried contact holes 170H may be formed among/between the bit lines 147. The inner space of each of the buried contact holes 170H may be between two adjacent bit lines 147 and defined by an active region 118 therebetween and insulating spacer structures 150 covering/contacting the respective side walls of the two adjacent bit lines 147. In some embodiments, each of the buried contact holes 170H may extend (e.g., in a vertical direction) from between two adjacent insulating spacer structures 150 into the active region 118.

A plurality of buried contacts 170 may be respectively formed/disposed in the buried contact holes 170H. The buried contacts 170 may fill a lower portion of the space among/between the insulating spacer structures 150 covering/contacting the side walls of the bit line structures 140.

In some embodiments, the buried contacts 170 may be arranged in lines in the first horizontal direction (the X direction) and the second horizontal direction (the Y direction). Each of the buried contacts 170 may extend from the active region 118 in the vertical direction (the Z direction) that is perpendicular to the substrate 110. The buried contacts 170 may respectively form the buried contacts BC in FIG. 2. The level of the top surface of each of the buried contacts 170 may be lower than the level of the top surface of the insulating capping line 148.

A plurality of landing pad holes 190H may be defined by the buried contacts 170 and the insulating spacer structures 150. The buried contacts 170 may be respectively exposed at the bottoms of the landing pad holes 190H A plurality of landing pads 190 may at least partially fill the landing pad holes 190H and may extend on (e.g., contact) the bit line structures 140. The landing pads 190 may be separated from each other by a recess 190R. Each of the landing pads 190 may include or be formed of a conductive barrier film and a conductive pad material layer disposed/formed on the conductive barrier film. For example, the conductive barrier film may include or be formed of metal, conductive metal nitride, or a combination thereof. In some embodiments, the conductive barrier film may have a stack structure of Ti/TiN. In some embodiments, the conductive pad material layer may include or be formed of tungsten (W). In some embodiments, a metal silicide film may be interposed between (e.g., vertically overlap) a landing pad 190 and a buried contact 170. The metal silicide film may include or be formed of cobalt silicide ($CoSi_x$), nickel silicide ($NiSi_x$), or manganese silicide ($MnSi_x$) but is not limited thereto.

The landing pads 190 may be respectively disposed on the buried contacts 170 and respectively and electrically connected to (e.g., contact) the buried contacts 170. The landing pads 190 may be respectively electrically connected to the active regions 118 through the buried contacts 170, respectively. The landing pads 190 may respectively form the landing pads LP in FIG. 2. Each of the buried contacts 170 may be interposed between two adjacent bit line structures 140, and each of the landing pads 190 may extend (e.g., vertically) from between two adjacent bit line structures 140 having a buried contact 170 therebetween to the top of one of the two adjacent bit line structures 140.

The recess 190R may be filled with an insulating structure 195. In some embodiments, the insulating structure 195 may include or may be an interlayer insulating layer and an etch stop film. For example, the interlayer insulating layer may include or be formed of an oxide, and the etch stop film may include or be formed of a nitride. Although it is illustrated in FIG. 3 that the top surface of the insulating structure 195 is at the same vertical level as the top surface of each of the landing pads 190, embodiments are not limited thereto. For example, the insulating structure 195 may fill the recess 190R and cover/contact the top surface of the landing pads 190 and thus have a top surface at a higher vertical level than the top surface of the landing pads 190.

An etch stop layer 300 and the capacitor structures 200, which include the lower electrodes 210, the capacitor dielectric layer 220, and the upper electrode 230, may be disposed/formed on the landing pads 190 and the insulating structure 195. For example, the etch stop layer 300 may include or be formed of a silicon nitride film or a silicon boron nitride (SiBN). The lower electrodes 210 may pass through the etch stop layer 300 to be in contact with the landing pads 190, respectively. The lower electrodes 210 may be respectively and electrically connected to the landing pads 190.

At least one support pattern may be in contact with the side walls of the lower electrodes 210 and may thus support the lower electrodes 210. Here, a first lower electrode 210*a*, a connecting lower electrode 210*b*, and a second lower electrode 210*c*, which are described below, may be collectively referred to as a lower electrode 210. In some embodiments, at least one support pattern may include a first support pattern 310, a second support pattern 320, a third support pattern 330, and a fourth support pattern 340, which are in contact with the side walls of a plurality of lower electrodes 210 and at different vertical levels to be separated from one another in the vertical direction (the Z direction). Here, the second support pattern 320 may be referred to as an intermediate support pattern. The first support pattern 310 below the second support pattern 320 may be referred to as a lower support pattern. Each of the third support pattern 330 and the fourth support pattern 340 above the second support pattern 320 may be referred to as an upper support pattern.

The first support pattern 310 may be at a higher vertical level than the etch stop layer 300 in the vertical direction (the Z direction) and in contact with the side walls of the lower electrodes 210. For example, the first support pattern 310 may vertically overlap the etch stop layer 300. The second support pattern 320 may be at a higher vertical level than the first support pattern 310 in the vertical direction (the Z direction) and in contact with the side walls of the lower electrodes 210. For example, the second support pattern 320 may vertically overlap the first support pattern 310. The first support pattern 310 may be in contact with the side walls of the lower electrodes 210 near the center/middle of the lower electrodes 210 in the vertical direction (the Z direction). In some embodiments, the first support pattern 310 may be in contact with the side walls of the lower electrodes 210 at a higher (e.g., slightly higher) vertical level than the center of the lower electrodes 210 in the vertical direction (the Z direction). In some embodiments, the first support pattern 310 may be in contact with the side walls of the lower electrodes 210 at a lower (e.g., slightly lower) vertical level than the center in the vertical direction (the Z direction) of the lower electrodes 210.

In some embodiments, the second support pattern 320 may be in contact with the side walls of the lower electrodes 210 at a higher vertical level than the center of the lower electrodes 210 in the vertical direction (the Z direction). For example, the second support pattern 320 may be at a vertical level that is lower than the topmost end of the lower electrodes 210 and higher than the center of the lower electrodes 210 in the vertical direction (the Z direction) to be in contact with the side walls of the lower electrodes 210. The lower electrodes 210 may protrude upward from the top surface of the second support pattern 320. For example, the top surface of the second support pattern 320 may be at lower vertical level than the topmost end of the lower electrodes 210. In an embodiment, the top surface of the second support pattern 320 may be at a lower vertical level than the bottom surface of the connecting lower electrode 210*b*, which is described below.

The third support pattern 330 may be at a high vertical level from the second support pattern 320 in the vertical direction (the Z direction) to be in contact with the side walls of the lower electrodes 210.

In some embodiments, the top surface of the fourth support pattern 340 may be at the same vertical level as the topmost end of the lower electrodes 210. Each of the first support pattern 310, the second support pattern 320, the third support pattern 330, and the fourth support pattern 340 may include or be formed of silicon nitride (SiN), silicon carbonitride (SiCN), N-rich SiN, or Si-rich SiN but is not limited thereto.

More or less support patterns than the first support pattern 310, the second support pattern 320, the third support pattern 330, and the fourth support pattern 340 may be provided in the semiconductor memory device 1. For example, three or less layers of support patterns or five or more layers of support patterns vertically overlapping each other may be provided in the semiconductor memory device 1 in certain embodiments.

The capacitor dielectric layer 220 may conformally cover the lower electrodes 210 and the surface of at least one of the first to fourth support patterns 310, 320, 330, and 340 contacting the side walls of the lower electrodes 210. In some embodiments, the capacitor dielectric layer 220 may be integrally formed to cover/contact the lower electrodes 210 and at least one of the first to fourth support patterns 310, 320, 330, and 340 together in a certain region, e.g., the memory cell region CR (in FIG. 2). The lower electrodes 210 may respectively form the storage nodes SN in FIG. 2.

Each of the lower electrodes 210 may have, but not limited to, a solid pillar shape having a circular horizontal cross-section. In some embodiments, the lower electrodes 210 may have a bent portion.

Each of the lower electrodes 210 may include the first lower electrode 210*a*, the connecting lower electrode 210*b*, and the second lower electrode 210*c*. The first lower electrode 210*a* may have a cylindrical shape with a closed bottom. The connecting lower electrode 210*b* may have a bottom surface connected to (e.g., contact) the top surface of the first lower electrode 210*a* and may be at a higher vertical level than the first lower electrode 210*a*. The second lower electrode 210*c* may be at a higher vertical level than the connecting lower electrode 210*b* and the first lower electrode 210*a*. The bottom surface of the second lower electrode 210*c* may be connected to (e.g., contact) the top surface of the connecting lower electrode 210*b*.

Each of the first lower electrode 210*a* and the second lower electrode 210*c* may have a cylindrical shape extending in the vertical direction (the Z direction). For example, each of the cylindrical shapes of the first lower electrode 210*a* and the second lower electrode 210*c* may have a rotational symmetry axis extending in the vertical direction. The top and bottom surfaces of each of the first lower electrode 210*a* and the second lower electrode 210*c* may have different areas from each other due to manufacturing processes. The area of the top surface of the first lower electrode 210*a* may be greater than the area of the bottom surface of the first lower electrode 210*a*. The area of the top surface of the second lower electrode 210*c* may be greater than the area of the bottom surface of the second lower electrode 210*c*.

The first lower electrode 210*a* and the second lower electrode 210*c* may be misaligned with each other in the first horizontal direction (the X direction). For example, the first lower electrode 210*a* and the second lower electrode 210*c* may be offset from each other. For example, the rotational symmetry axes of the first lower electrode 210*a* and the second lower electrode 210*c* may not overlap in the vertical direction.

When the offset between the first lower electrode 210*a* and the second lower electrode 210*c* increases to or above a certain value, it is not desirable/acceptable in the configuration of a semiconductor memory device according to an embodiment, and accordingly, the offset value may be limited within a certain range. For example, the offset value indicating the degree of offset between the first lower electrode 210*a* and the second lower electrode 210*c* may be less than the vertical length of the first lower electrode 210*a* or the second lower electrode 210*c*. For example, the offset value may be a horizontal distance between the rotational symmetry axes of the first lower electrode 210*a* and the second lower electrode 210*c*.

When the first lower electrode 210*a* and the second lower electrode 210*c* are misaligned with (e.g., shifted from) each other in the first horizontal direction (the X direction), a plane formed by a side surface of the first lower electrode 210*a* facing an upper electrode 230P may not be the same as a plane formed by a side surface the second lower electrode 210*c* facing the upper electrode 230P. Alternatively, at least a part (of the shape) of the first lower electrode 210*a* vertically overlapping with the substrate 110 may vertically overlap with at least a part (of the shape) of the second lower electrode 210*c* vertically overlapping with the substrate 110.

In a state where the first lower electrode 210*a* and the second lower electrode 210*c* are misaligned with each other in the first horizontal direction (the X direction), the top surface of the first lower electrode 210*a* may be connected to the bottom surface of the second lower electrode 210*c* by the connecting lower electrode 210*b*. Because the plane formed by the side surface of the first lower electrode 210*a* does not coincide with the plane formed by the side surface of the second lower electrode 210*c*, the connecting lower electrode 210*b* connecting the first lower electrode 210*a* to the second lower electrode 210*c* may include a bent/inclined portion.

Each of the lower electrodes 210 may include a first connection surface/boundary 210FA, in which the top surface of the first lower electrode 210*a* is in contact with the bottom surface of the connecting lower electrode 210*b*, and a second connection surface/boundary 210FB, in which the bottom surface of the second lower electrode 210*c* is in contact with the top surface of the connecting lower electrode 210*b*.

The horizontal cross-sectional area of the first connection surface/boundary 210FA, in which the top surface of the first lower electrode 210*a* is in contact with the bottom surface of the connecting lower electrode 210*b*, may be substantially the same as the horizontal cross-sectional area of the first lower electrode 210*a*. The horizontal cross-sectional area of the second connection surface/boundary 210FB, in which the bottom surface of the second lower electrode 210*c* is in contact with the top surface of the connecting lower electrode 210*b*, may be substantially the same as the horizontal cross-sectional area of the second lower electrode 210*c*. Here, "being the same" means being the same considering errors that may occur during manufacturing processes. Here, horizontal cross-sectional area may refer to an area of a cross-section parallel to a plane formed by the first horizontal direction (the X direction) and the second horizontal direction (the Y direction). For example, the horizontal cross-sectional area may refer to an area of a cross-section on an X-Y plane.

In some embodiments, the lower electrodes 210 may be arranged to zigzag in the first horizontal direction (the X direction) or the second horizontal direction (the Y direction) in a honeycomb pattern. In some embodiments, the lower electrodes 210 may be arranged in lines in the first horizontal direction (the X direction) and the second horizontal direction (the Y direction) in a matrix pattern. The lower electrodes 210 may include or be formed of impurity-doped silicon, a metal, such as tungsten or copper, or a conductive metal compound, such as titanium nitride. Although it is illustrated in FIG. 3 that the top surface of the insulating structure 195 is at the same vertical level as the bottom surface of the lower electrodes 210, embodiments are not limited thereto.

For example, the capacitor dielectric layer 220 may include or be formed of TaO, TaAlO, TaON, AlO, AlSiO, HfO, HfSiO, ZrO, ZrSiO, TiO, TiAlO, BST((Ba, Sr)TiO), STO(SrTiO), BTO(BaTiO), PZT(Pb(Zr, Ti)O), (Pb, La)(Zr, Ti)O, Ba(Zr, Ti)O, Sr(Zr, Ti)O, or a combination thereof.

The upper electrode 230 may include or be formed of one of a doped semiconductor material layer, a main electrode layer, and an interface layer or a stack structure of at least two thereof. For example, the doped semiconductor material layer may include or be formed of at least one of doped polysilicon and doped polycrystalline silicon germanium (SiGe). The main electrode layer may include or be formed of a metal material. For example, the main electrode layer may include or be formed of W, Ru, RuO, Pt, PtO, Ir, IrO, SRO(SrRuO), BSRO((Ba, Sr)RuO), CRO(CaRuO), BaRuO, La(Sr, Co)O, or the like. In some embodiments, the main electrode layer may include or be formed of tungsten W. The interface layer may include or be formed of at least one selected from the group consisting of metal oxide, metal nitride, metal carbide, and metal silicide.

The upper electrode 230P may be surrounded by the lower electrodes 210, the first to fourth support patterns 310, 320, 330, and 340, and the etch stop layer 300 and arranged in space among/between the lower electrodes 210. A portion of the upper electrode 230P disposed between the lower electrodes 210 may include or may be a bent portion. A portion of the upper electrode 230P disposed between connecting lower electrodes 210*b* and between second lower electrodes 210*c* may include or may be a bent portion. A bent upper electrode 230B—e.g., a bent portion of the upper electrode—may be at a side of (e.g., laterally overlap) a connecting lower electrode 210*b*. The bent upper electrode 230B may include a first bent upper electrode 230BA—e.g., a first portion of the bent upper electrode—and a second bent upper electrode 230BB—e.g., a second portion of the bent upper electrode—connected to the top end of the first bent upper electrode 230BA.

A side surface of the first bent upper electrode 230BA may face and be separated from a side surface of the connecting lower electrode 210*b*. For example, the side surface of the first bent upper electrode 230BA may overlap the side surface of the connecting lower electrode 210*b* in a lateral direction (e.g., in a horizontal direction). A side surface of the second bent upper electrode 230BB may face and be separated from a side surface of a second lower electrode 210*c*. For example, the side surface of the second bent upper electrode 230BB may overlap the side surface of the second lower electrode 210*c* in a lateral direction (e.g., in a horizontal direction). The side surface of the second bent upper electrode 230BB may face and be parallel with the side surface of the second lower electrode 210*c*. The side surface of the first bent upper electrode 230BA may be separated from the side surface of the connecting lower electrode 210*b* by a constant distance. For example, the side surface of the first bent upper electrode 230BA may be parallel to the side surface of the connecting lower electrode 210*b*. The side surface of the second bent upper electrode 230BB may be separated from the side surface of the second lower electrode 210*c* by a constant distance.

The upper electrode 230 may be divided into the first bent upper electrode 230BA and the second bent upper electrode 230BB based on the second connection surface/boundary 210FB as a boundary between them. The first bent upper electrode 230BA may be at a side of the connecting lower electrode 210*b*, and the second bent upper electrode 230BB may be at a side of the second lower electrode 210*c*.

The bottom surface of the first bent upper electrode 230BA may be at the same vertical level as the first connection surface/boundary 210FA. Alternatively, the bottom surface of the first bent upper electrode 230BA may be at a higher vertical level than the first connection surface/boundary 210FA.

The first bent upper electrode 230BA may include a bent/inclined portion (e.g., with respect to a horizontal/vertical direction). Alternatively, a bend may occur in a plane in which the top surface of the first bent upper electrode 230BA meets the bottom surface of the second bent upper electrode 230BB. For example, a plane formed by a side surface of the first bent upper electrode 230BA may not be parallel with a plane formed by a side surface of the second bent upper electrode 230BB. The respective planes of portions of the upper electrode 230P arranged between (e.g., laterally overlapping) the lower electrodes 210, except for the first bent upper electrode 230BA, may be parallel with each other.

A surface of the second lower electrode 210*c* facing the second bent upper electrode 230BB may be parallel with a surface of the second bent upper electrode 230BB facing the second lower electrode 210*c*. A surface of the connecting lower electrode 210*b* facing the first bent upper electrode 230BA may be parallel with a surface of the first bent upper electrode 230BA facing the connecting lower electrode 210*b*. The second bent upper electrode 230BB may be separated (e.g., spaced apart) from the second lower electrode 210*c* by the capacitor dielectric layer 220. The first bent upper electrode 230BA may be separated (e.g., spaced apart) from the second lower electrode 210*c* by the capacitor dielectric layer 220.

A vertical height from the bottom surface of the first lower electrode 210*a* to the top surface of the first lower electrode 210*a* including the first connection surface 210FA may be referred to as a first height H1. A vertical height from the first connection surface 210FA corresponding to the bottom surface of the connecting lower electrode 210*b* to the second connection surface 210FB corresponding to the top surface of the connecting lower electrode 210*b* may be referred to as a second height H2. A vertical height from the second connection surface 210FB corresponding to the bottom surface of the second lower electrode 210*c* to the top surface of the second lower electrode 210*c* may be referred to as a third height H3.

The second height H2 corresponding to the vertical height of the connecting lower electrode 210*b* may be less than each of the first height H1 and the third height H3. In an embodiment, the second height H2 may be less than or equal to ⅕ of the first height H1 or the third height H3. A ratio of the second height H2 to the first height H1 may be less than or equal to 0.2. A ratio of the second height H2 to the third height H3 may be less than or equal to 0.2. The first height H1 corresponding to the vertical height of the first lower electrode 210*a* may be greater than or equal to the third height H3 corresponding to the vertical height of the second lower electrode 210*c*. The third height H3 may be greater than the second height H2, and the first height H1 may be greater than or equal to the third height H3. Here, it will be understood by one of ordinary skill in the art that the lengths and ratios of elements of the capacitor structure 200 may be reduced for convenience of illustration.

To increase the performance of a semiconductor memory device by increasing the capacitance of a capacitor of the semiconductor memory device, a lower electrode of the semiconductor memory device may be formed to have a two-stage pillar structure. An upper pillar and a lower pillar of the two-stage pillar structure may be misaligned with each other.

In an embodiment, the first lower electrode 210*a* corresponding to the lower pillar and the second lower electrode 210*c* corresponding to the upper pillar may be misaligned with each other but may be connected to each other by the connecting lower electrode 210*b*. A larger contact area may be secured when the first lower electrode 210*a* is in contact with the connecting lower electrode 210*b* than when the first lower electrode 210*a* is in contact with the second lower electrode 210*c*. A larger contact area may be secured when the second lower electrode 210*c* is in contact with the connecting lower electrode 210*b* than when the first lower electrode 210*a* is in contact with the second lower electrode 210*c*, e.g., because a vertically overlapping area between the top surface of the connecting lower electrode 210*b* and the bottom surface of the second lower electrode 210*c* is greater than a vertically overlapping area between the top surface of the first lower electrode 210*a* and the bottom surface of the second lower electrode 210*c*. Accordingly, the electrical characteristics of the semiconductor memory device 1 according to an embodiment may be improved.

When the connecting lower electrode 210*b* is provided between the first lower electrode 210*a* and the second lower electrode 210*c*, the first lower electrode 210*a* may be continuously connected to the second lower electrode 210*c*. Accordingly, the surface area of a lower electrode 210 formed as a two-stage pillar may increase. Accordingly, the capacitance of a capacitor of the semiconductor memory device 1 according to an embodiment may increase.

FIGS. 4A to 4G are cross-sectional views of stages in a method of manufacturing a semiconductor memory device of an embodiment. Only the upper portions of the landing pads 190 and the insulating structure 195 and above the landing pads 190 and the insulating structure 195 of FIG. 3 are shown in FIGS. 4A to 4G, and the portion therebelow is omitted from FIGS. 4A to 4G for convenience. A portion shown in FIGS. 4A to 4G may correspond to a part of the memory cell region CR of FIG. 2.

Figure 4A:
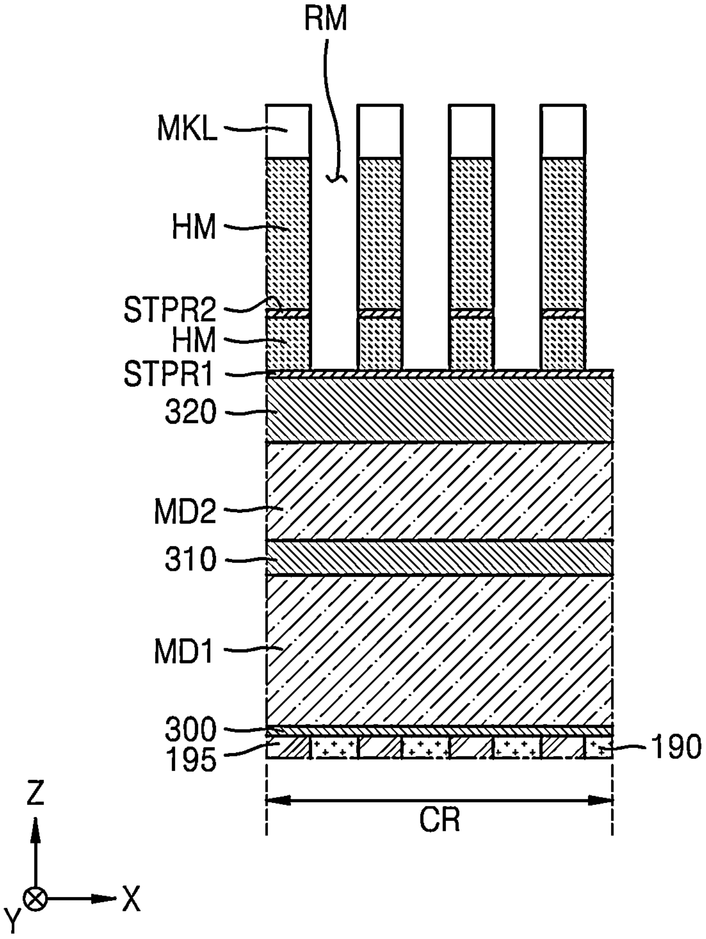
FIGS. 4A to 4G are cross-sectional views of stages in a method of manufacturing a semiconductor memory device of an embodiment.

Referring to FIG. 4A, the etch stop layer 300, a first mold layer MD1, the first support pattern 310, a second mold layer MD2, the second support pattern 320, a first etch stop layer STPR1, a hard mask HM, a second etch stop layer STPR2, and a hard mask HM may be sequentially formed on the landing pads 190 and the insulating structure 195. A mask layer MKL having patterns may be formed on the topmost hard mask HM. A plurality of recess patterns RM arranged at certain intervals may be formed in the hard mask HM on the first etch stop layer STPR1, the second etch stop layer STPR2, and the hard mask HM thereon through the patterns of the mask layer MKL. The recess patterns RM may be formed by anisotropic etching. For example, the anisotropic etching may be carried out by a method, such as high density plasma (HDP) etching, reactive ion etching, sputter etching, or reactive ion beam etching. However, the inventive concept is not limited to these methods.

Figure 4B:
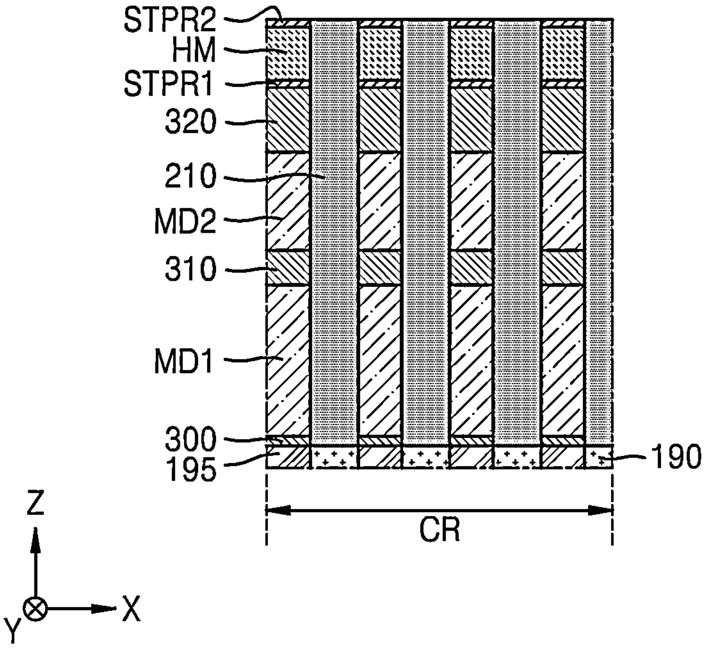

Referring to FIG. 4B, the etch stop layer 300, the first mold layer MD1, the first support pattern 310, the second mold layer MD2, the second support pattern 320, and the first etch stop layer STPR1 may be patterned by using the mask layer MKL as an etch mask. Through the patterning, the landing pads 190 may be exposed. Thereafter, a portion of each of the lower electrodes 210 may be formed in each patterned portion. After the portion of each of the lower electrodes 210 is formed, the layers on the second etch stop layer STPR2 may be removed by etch back and/or chemical mechanical polishing (CMP).

Figure 4C:
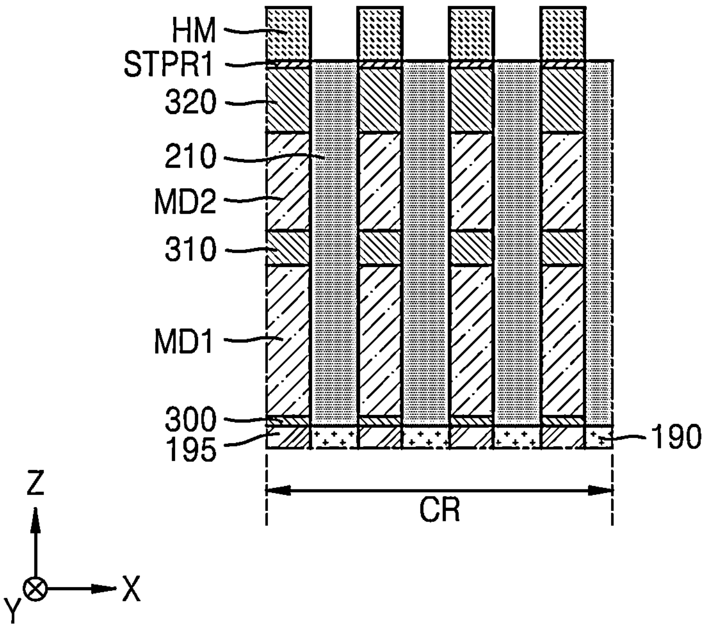

Referring to FIG. 4C, a portion of each of the lower electrodes 210 may be etched and removed, and the second etch stop layer STPR2 may be removed.

Figure 4D:
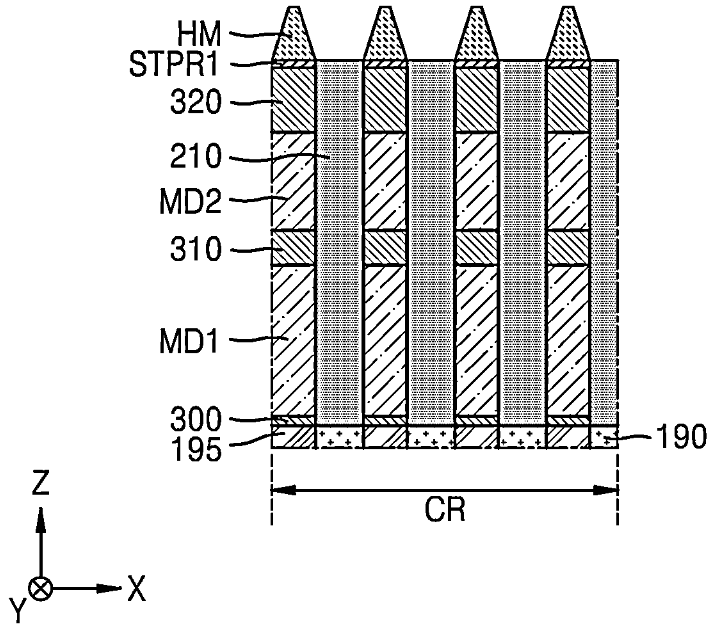

Referring to FIG. 4D, the hard mask HM exposed in FIG. 4C may be eroded to have a sharp top end.

Figure 4E:
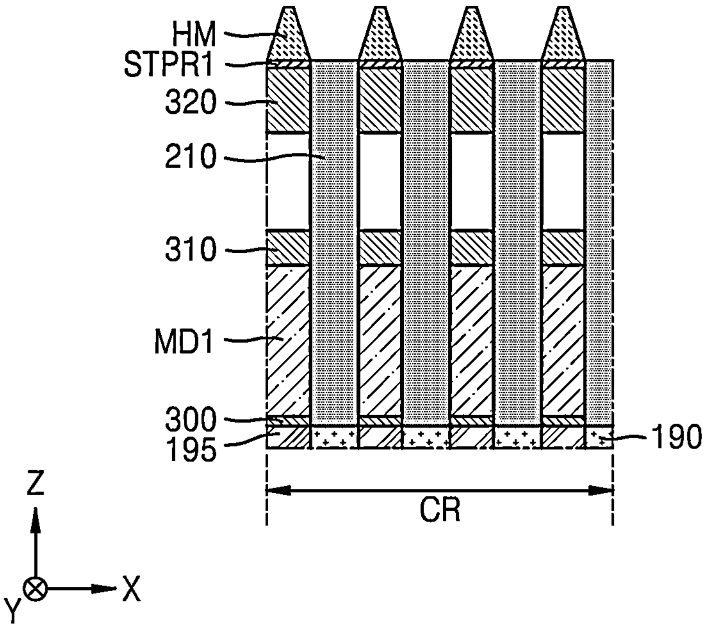
Figure 4F:
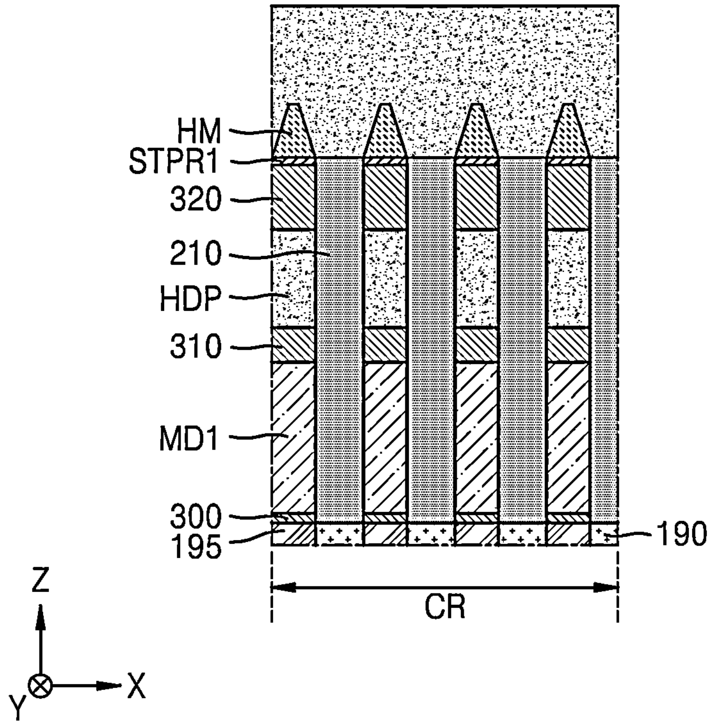

Referring to FIGS. 4E and 4F, a surrounding structure (e.g., exposed surfaces) may be etched, and the second mold layer MD2 may be removed. An oxide membrane layer HDP may be formed by performing vapor deposition in a space resulting from (e.g., formed by) the removal of the second mold layer MD2. Simultaneously, the oxide membrane layer HDP may also be deposited on the hard mask HM. In an embodiment, the oxide membrane layer HDP may include or be formed of HDP oxide.

Figure 4G:
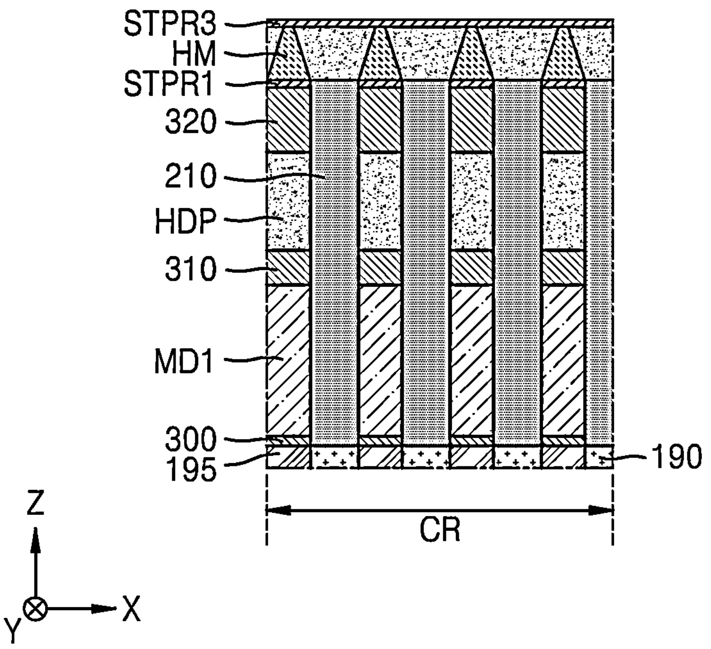

Referring to FIG. 4G, the oxide membrane layer HDP formed on the hard mask HM may be removed by CMP to expose an end (e.g., a top) of the hard mask HM. Thereafter, a third etch stop layer STPR3 may be formed on a plane (e.g., a horizontal plane) formed by the hard mask HM and a planarized oxide membrane layer. An intermediate mold layer MDC may be provided below the third etch stop layer STPR3. The intermediate mold layer MDC has been formed together with the oxide membrane layer HDP described above. For example, the intermediate mold layer MDC may be formed by a remaining portion of the oxide membrane layer HDP formed on the hard mask HM after the oxide membrane layer HDP is removed by the CMP.

FIGS. 5A to 5G are cross-sectional views of stages in a method of manufacturing a semiconductor memory device of an embodiment. Only the upper portions of the landing pads 190 and the insulating structure 195 and above the landing pads 190 and the insulating structure 195 of FIG. 3 are shown in FIGS. 5A to 5G, and the portion therebelow is omitted from FIGS. 5A to 5G. A portion shown in FIGS. 5A to 5G may correspond to a part of the memory cell region CR of FIG. 2.

Figure 5A:
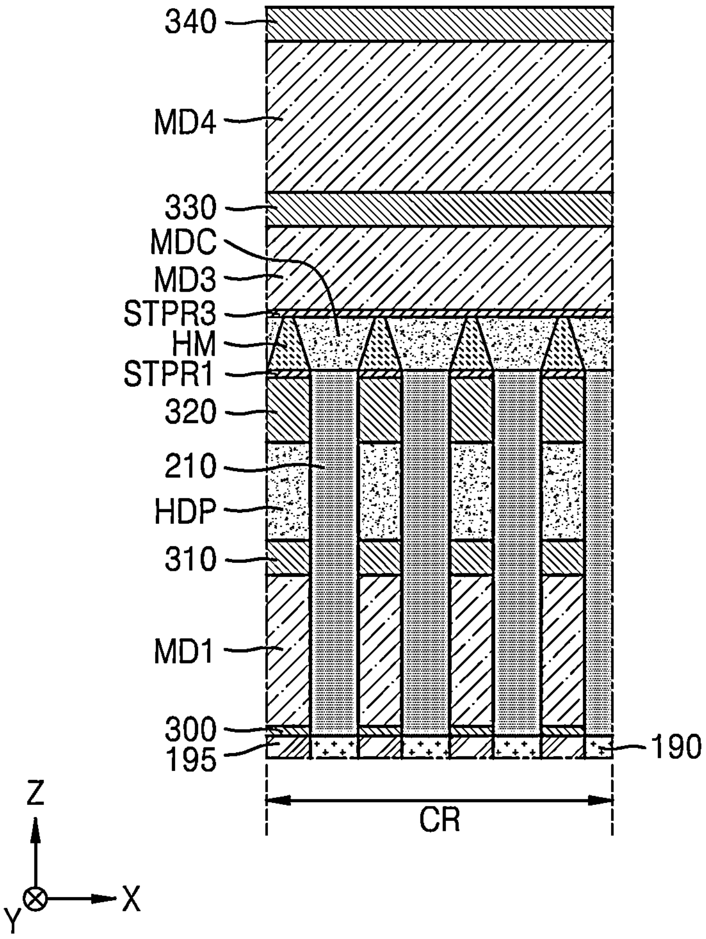
FIGS. 5A to 5G are cross-sectional views of stages in a method of manufacturing a semiconductor memory device of an embodiment.

Referring to FIG. 5A, a third mold layer MD3, the third support pattern 330, a fourth mold layer MD4, and the fourth support pattern 340 may be sequentially formed on the third etch stop layer STPR3 that is the topmost layer of the resultant structure of the previous process as shown in FIG. 4G.

Figure 5B:
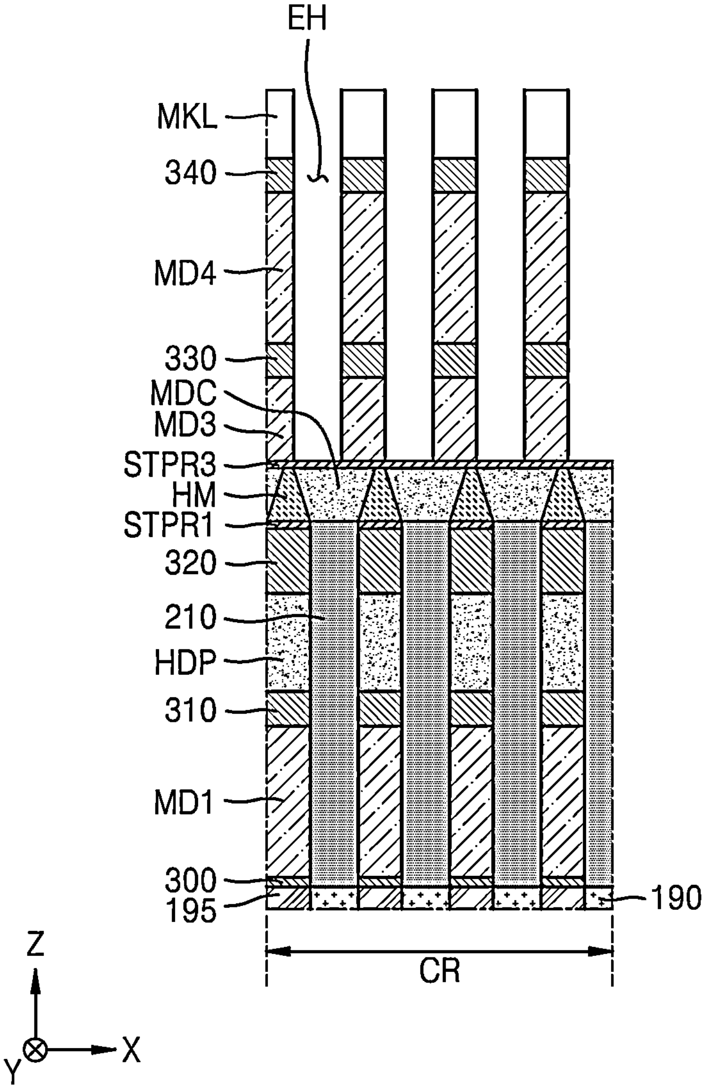

Referring to FIG. 5B, a mask layer MKL having patterns may be formed on the fourth support pattern 340. Etching is performed according to (e.g., using) the patterns of the mask layer MKL and stopped by the third etch stop layer STPR3 to form etch holes EH.

Figure 5C:
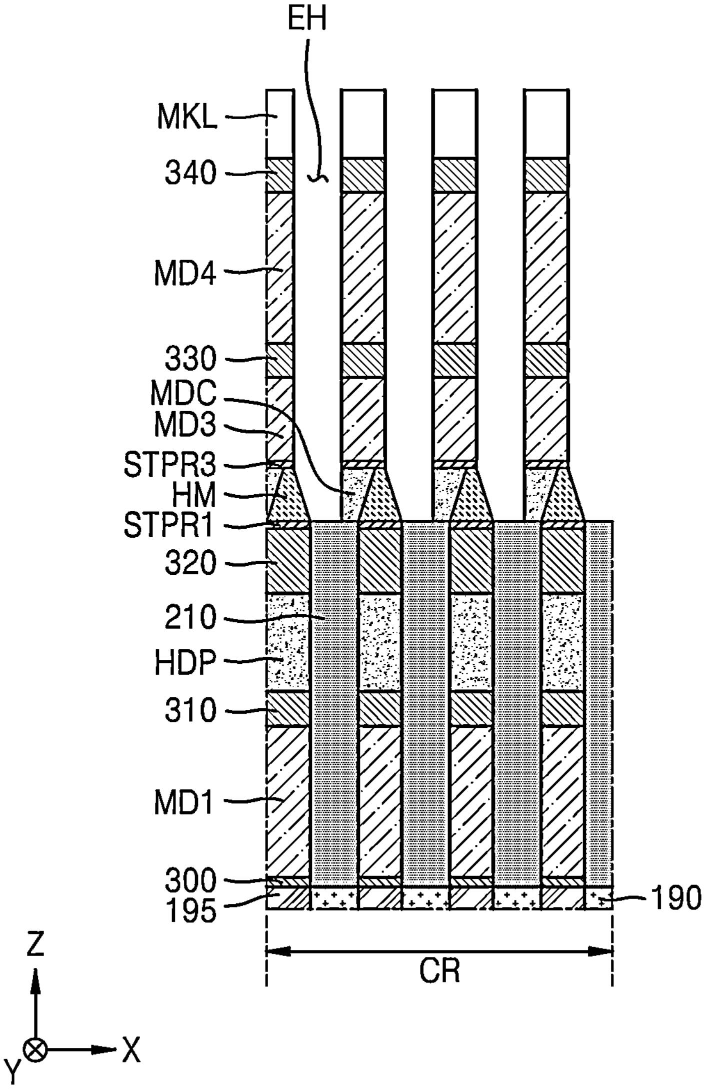

Referring to FIG. 5C, the third etch stop layer STPR3 and the intermediate mold layer MDC may be etched and removed through the etch holes EH. However, the hard mask HM may not be removed, e.g., by an etch selectivity between the hard mask HM and the other layers. Therefore, at least a portion of an upper part of each of the lower electrodes 210 may be exposed by one of the etch holes EH.

Figure 5D:
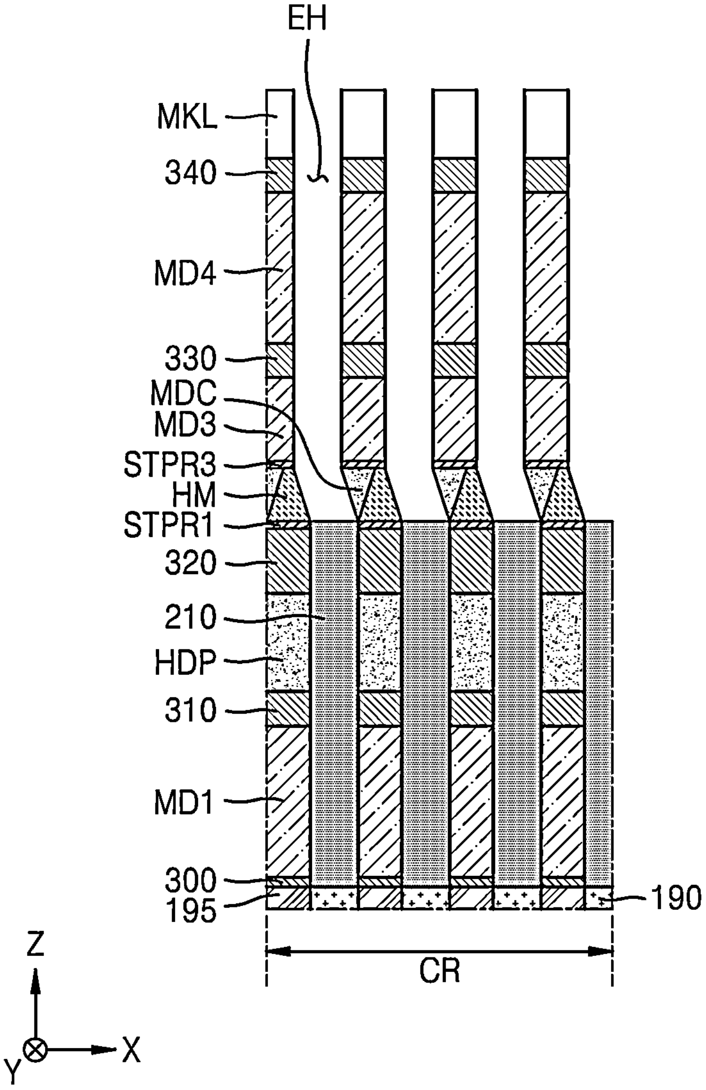

Referring to FIG. 5D, the etch amount of the intermediate mold layer MDC may increase from the top of the hard mask HM toward the bottom of the hard mask HM. For example, the bottom of the intermediate mold layer MDC may be narrower than the top of the intermediate mold layer MDC. For example, widths of the intermediate mold layer MDC in a horizontal direction may decrease in a direction approaching the first etch stop layer STPR1. An etch selectivity may be adjusted such that the intermediate mold layer MDC is removed while the hard mask HM is not removed.

Figure 5E:
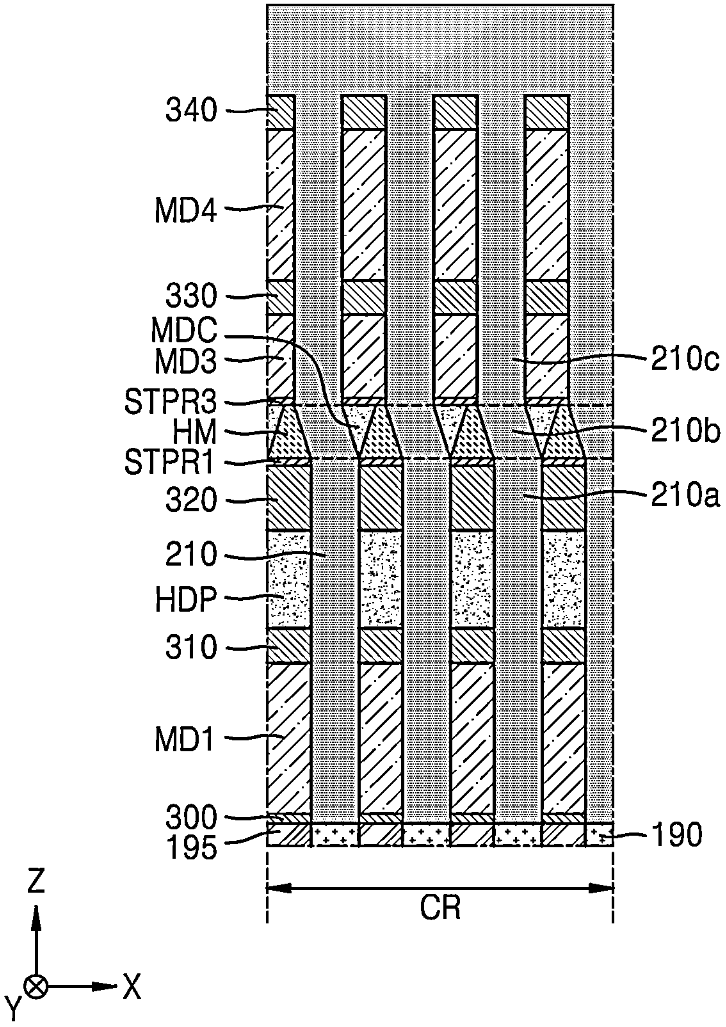

Referring to FIG. 5E, the lower electrodes 210 may be formed through vapor deposition. In the process of forming the lower electrodes 210, the lower electrodes 210 may be formed to a higher vertical level than the top surface of the fourth support pattern 340.

Figure 5F:
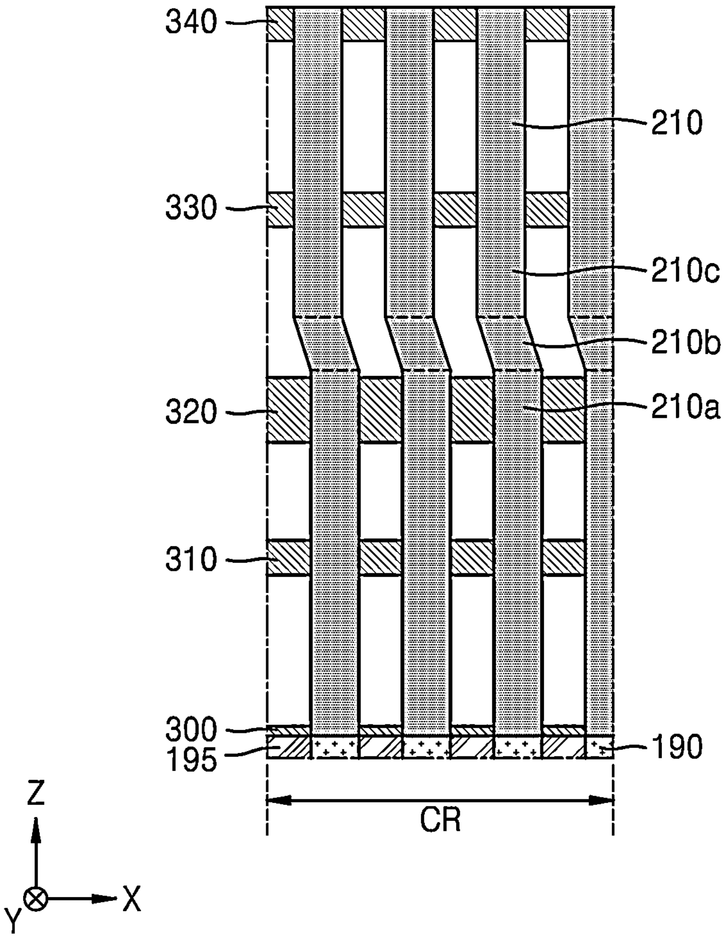

Referring to FIG. 5F, CMP may be performed on the material layer for the lower electrodes 210 to expose the top surface of the fourth support pattern 340. Thereafter, the first mold layer MD1, the oxide membrane layer HDP, the hard mask HM, the third mold layer MD3, and the fourth mold layer MD4 in FIG. 5E may be removed.

Figure 5G:
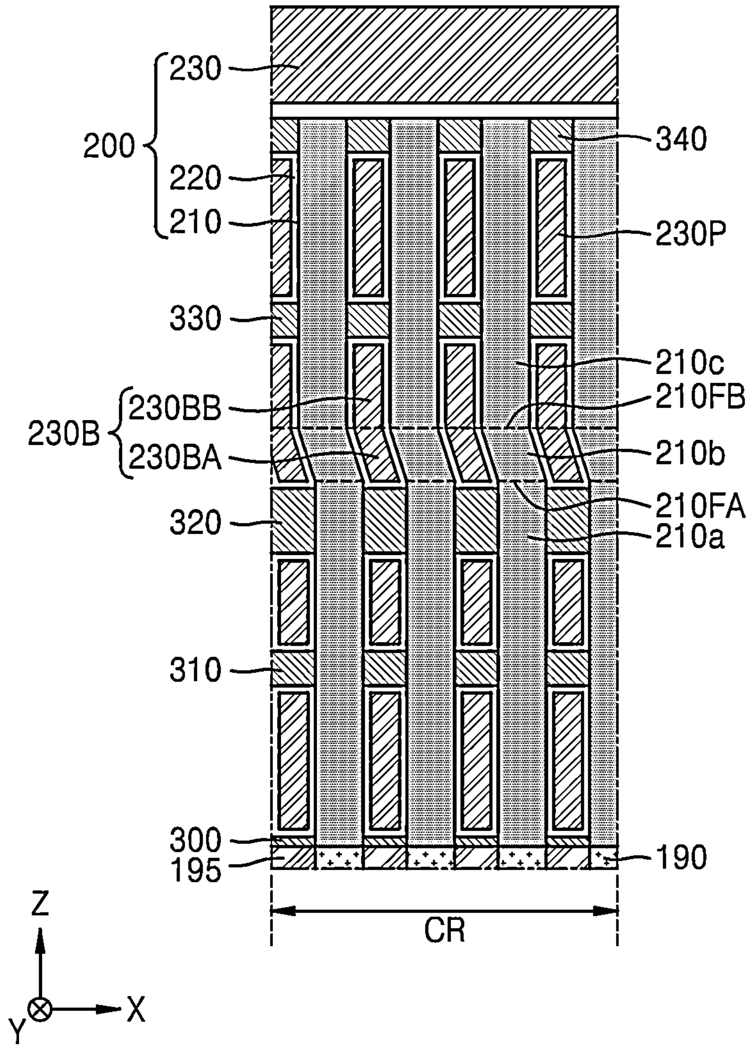

Referring to FIG. 5G, the capacitor dielectric layer 220, which covers/contacts surfaces of the lower electrodes 210 and surfaces of the first support pattern 310, the second support pattern 320, the third support pattern 330, and the fourth support pattern 340 which are in contact with the side walls of the lower electrodes 210, and the upper electrode 230 covering the capacitor dielectric layer 220 may be formed. The upper electrode 230P may fill at least a part of the space resulting from the removal of the first mold layer MD1, the oxide membrane layer HDP, the hard mask HM, the third mold layer MD3, and the fourth mold layer MD4.

Even though different figures illustrate variations of exemplary embodiments and different embodiments disclose different features from each other, these figures and embodiments are not necessarily intended to be mutually exclusive from each other. Rather, features depicted in different figures and/or described above in different embodiments can be combined with other features from other figures/embodiments to result in additional variations of embodiments, when taking the figures and related descriptions of embodiments as a whole into consideration. For example, components and/or features of different embodiments described above can be combined with components and/or features of other embodiments interchangeably or additionally to form additional embodiments unless the context indicates otherwise.

While the inventive concept has been particularly shown and described with reference to embodiments thereof, it will be understood that various changes in form and details may be made therein without departing from the spirit and scope of the following claims.

What is claimed is:

1. A semiconductor memory device comprising:

a substrate having a memory cell region; and a plurality of capacitor structures in the memory cell region of the substrate, each of the plurality of capacitor structures including a lower electrode, a capacitor dielectric layer, and an upper electrode, wherein the lower electrode includes a first lower electrode, a second lower electrode above the first lower electrode, a connecting lower electrode connecting a top end of the first lower electrode to a bottom end of the second lower electrode, a first connection surface formed by a top surface of the first lower electrode and a bottom surface of the connecting lower electrode directly connected to each other, and a second connection surface formed by a bottom surface of the second lower electrode and a top surface of the connecting lower electrode directly connected to each other, and wherein the upper electrode includes a bent upper electrode overlapping the connecting lower electrode in a horizontal direction, and the bent upper electrode includes a bent portion.

2. The semiconductor memory device of claim 1, wherein the bent upper electrode includes a first bent upper electrode and a second bent upper electrode, the first bent upper electrode has a side surface separated from and facing a side surface of the connecting lower electrode, and the second bent upper electrode is connected to a top end of the first bent upper electrode and has a side surface separated by a constant distance from and parallel with a side surface of the second lower electrode, and the horizontal direction being parallel to a main surface of the substrate.

3. The semiconductor memory device of claim 2, wherein a plane formed by a side surface of the first lower electrode facing the upper electrode does not coincide with a plane formed by the side surface of the second lower electrodes facing the upper electrode.

4. The semiconductor memory device of claim 2, wherein the first lower electrode is offset from the second lower electrode.

5. The semiconductor memory device of claim 4, wherein a value of the offset between the first lower electrode and the second lower electrode is less than a vertical length of one of the first lower electrode and the second lower electrode.

6. The semiconductor memory device of claim 4, further comprising an intermediate support pattern below the bent upper electrode and facing a bottom surface of the bent upper electrode, the intermediate support pattern supporting the first lower electrode by contacting a portion of a side wall of the first lower electrode, the portion of the side wall of the first lower electrode being at a lower level than the connecting lower electrode.

7. The semiconductor memory device of claim 6, further comprising:

a lower support pattern supporting the first lower electrode by contacting the side wall of the first lower electrode; and an upper support pattern at a higher vertical level than the lower support pattern, the upper support pattern supporting the second lower electrode by contacting a side wall of the second lower electrode.

8. The semiconductor memory device of claim 4, wherein the bent upper electrode is separated from the connecting lower electrode, and the capacitor dielectric layer is interposed between the bent upper electrode and the connecting lower electrode.

9. The semiconductor memory device of claim 4, wherein a vertical level of the second connection surface is substantially the same as a vertical level of a surface having the first bent upper electrode and the second bent upper electrode meeting each other therein.

10. The semiconductor memory device of claim 4, wherein a horizontal cross-sectional area of the first connection surface is equal to a horizontal cross-sectional area of the first lower electrode, and a horizontal cross-sectional area of the second connection surface is equal to a horizontal cross-sectional area of the second lower electrode.

11. The semiconductor memory device of claim 1, wherein a horizontal width of the first connection surface is substantially the same as a horizontal width of the second connection surface.

12. The semiconductor memory device of claim 1, wherein a ratio of a vertical height of the second lower electrode to a vertical height of the first lower electrode is less than or equal to 1.

13. The semiconductor memory device of claim 12, wherein a ratio of a vertical height of the connecting lower electrode to the vertical height of the first lower electrode is less than or equal to 0.2.

14. The semiconductor memory device of claim 1, wherein a vertical height of the second lower electrode is greater than a vertical height of the connecting lower electrode, and a vertical height of the first lower electrode is greater than the vertical height of the second lower electrode.

15. A semiconductor memory device comprising:

a substrate having a memory cell region; and a plurality of capacitor structures in the memory cell region of the substrate, each of the plurality of capacitor structures including a lower electrode, a capacitor dielectric layer, and an upper electrode, wherein the lower electrode includes:

a first lower electrode, a second lower electrode above the first lower electrode in a vertical direction perpendicular to a main surface of the substrate, a connecting lower electrode connecting a top end of the first lower electrode to a bottom end of the second lower electrode so that the first lower electrode and the second lower electrode are continuously connected, a first connection surface formed by a top surface of the first lower electrode and a bottom surface of the connecting lower electrode directly connected to each other, a second connection surface formed by a bottom surface of the second lower electrode and a top surface of the connecting lower electrode directly connected to each other, wherein:

the upper electrode includes a portion covering and overlapping the lower electrode in the vertical direction and further includes a bent upper electrode overlapping a side surface of the connecting lower electrode in a horizontal direction perpendicular to the vertical direction, and the bent upper electrode includes a bent portion, the bent upper electrode includes a first bent upper electrode and a second bent upper electrode, the first bent upper electrode has a side surface separated by a constant distance from and facing the side surface of the connecting lower electrode, and the second bent upper electrode is connected to a top end of the first bent upper electrode and has a side surface separated by a constant distance from and parallel with a side surface of the second lower electrode, and the first lower electrode is offset from the second lower electrode in the horizontal direction.

16. The semiconductor memory device of claim 15, wherein at least a part of the first lower electrode overlaps with at least a part of the second lower electrode in the vertical direction.

17. The semiconductor memory device of claim 15, further comprising an intermediate support pattern below the bent upper electrode and vertically overlapping a bottom surface of the bent upper electrode, the intermediate support pattern supporting the first lower electrode by contacting a portion of a side wall of the first lower electrode.

18. The semiconductor memory device of claim 15, wherein an area of a bottom surface of the first lower electrode is less than an area of the top surface of the first lower electrode, and an area of the bottom surface of the second lower electrode is less than an area of a top surface of the second lower electrode.

19. A semiconductor memory device comprising:

a substrate having a memory cell region; and a plurality of capacitor structures in the memory cell region of the substrate, each of the plurality of capacitor structures including a lower electrode, a capacitor dielectric layer, and an upper electrode, wherein the lower electrode includes;

a first lower electrode, a second lower electrode above the first lower electrode in a vertical direction perpendicular to a main surface of the substrate, a connecting lower electrode connecting a top end of the first lower electrode to a bottom end of the second lower electrode so that the first lower electrode and the second lower electrode are continuously connected, a first connection surface formed by a top surface of the first lower electrode and a bottom surface of the connecting lower electrode directly connected to each other, and a second connection surface formed by a bottom surface of the second lower electrode and a top surface of the connecting lower electrode directly connected to each other, wherein:

the upper electrode includes a bent upper electrode overlapping the connecting lower electrode in a horizontal direction perpendicular to the vertical direction and the bent upper electrode includes a bent portion, the bent upper electrode includes a first bent upper electrode and a second bent upper electrode, the first bent upper electrode having a side surface separated by a constant distance from and facing a side surface of the connecting lower electrode, and the second bent upper electrode connected to a top end of the first bent upper electrode and having a side surface separated by a constant distance from and parallel with a side surface of the second lower electrode, and the first lower electrode is offset from the second lower electrode in the horizontal direction, and a value of the offset between the first lower electrode and the second lower electrode is less than a vertical length along the vertical direction of one of the first lower electrode and the second lower electrode.

20. The semiconductor memory device of claim 19, further comprising:

a lower support pattern supporting the first lower electrode by being in contact with a side wall of the first lower electrode of one of the plurality of capacitor structures;

an upper support pattern at a higher vertical level than the lower support pattern, the upper support pattern supporting the second lower electrode by being in contact with a side wall of the second lower electrode; and an intermediate support pattern below the bent upper electrode and facing a bottom surface of the bent upper electrode, the intermediate support pattern supporting the first lower electrode by being in contact with a portion of the side wall of the first lower electrode, wherein the capacitor dielectric layer is interposed between the bent upper electrode and the connecting lower electrode separated from each other, a vertical level of the second connection surface is substantially the same as a vertical level of a boundary between the first bent upper electrode and the second bent upper electrode, an area of the first connection surface is greater than or equal to a half of a horizontal cross-sectional area of the first lower electrode, and an area of the second connection surface is greater than or equal to a half of a horizontal cross-sectional area of the second lower electrode.

* * * * *